United States Patent
Shiomi et al.

(10) Patent No.: US 11,456,406 B2
(45) Date of Patent: Sep. 27, 2022

(54) SILICON BULK THERMOELECTRIC CONVERSION MATERIAL

(71) Applicant: JAPAN SCIENCE AND TECHNOLOGY AGENCY, Kawaguchi (JP)

(72) Inventors: Junichiro Shiomi, Tokyo (JP); Makoto Kashiwagi, Tokyo (JP); Takashi Kodama, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 92 days.

(21) Appl. No.: 16/957,642

(22) PCT Filed: Dec. 26, 2018

(86) PCT No.: PCT/JP2018/047940
§ 371 (c)(1),
(2) Date: Jun. 24, 2020

(87) PCT Pub. No.: WO2019/131795
PCT Pub. Date: Jul. 4, 2019

(65) Prior Publication Data
US 2021/0057626 A1 Feb. 25, 2021

(30) Foreign Application Priority Data
Dec. 26, 2017 (JP) .............................. JP2017-249463

(51) Int. Cl.
*H01L 35/22* (2006.01)
*H01L 35/34* (2006.01)
(Continued)

(52) U.S. Cl.
CPC .............. *H01L 35/22* (2013.01); *B22F 1/054* (2022.01); *C01B 33/02* (2013.01); *H01L 35/34* (2013.01);
(Continued)

(58) Field of Classification Search
None
See application file for complete search history.

(56) References Cited

U.S. PATENT DOCUMENTS

| 7,002,071 B1 | 2/2006 | Sadatomi | |
| 2011/0108523 A1* | 5/2011 | Yang | C08J 9/26 522/170 |

(Continued)

FOREIGN PATENT DOCUMENTS

| JP | 2000261044 A | 9/2000 |
| JP | 2011249672 A | 12/2011 |

(Continued)

OTHER PUBLICATIONS

Decision to Grant a Patent issued in Japanese Patent Application No. 2019-562126 dated Oct. 5, 2021. English machine translation provided.

(Continued)

*Primary Examiner* — Ronak C Patel
(74) *Attorney, Agent, or Firm* — Rossi, Kimms & McDowell LLP

(57) ABSTRACT

Provided is a silicon bulk thermoelectric conversion material in which thermoelectric performance is improved by reducing the thermal conductivity as compared with the prior art. In the silicon bulk thermoelectric conversion material, the ZT is greater than 0.2 at room temperature with the elemental silicon. In the silicon bulk thermoelectric conversion material, a plurality of silicon grains have an average of 1 nm or more and 300 nm or less, a first hole have an average (Continued)

of 1 nm or more and 30 nm or less present in the plurality of silicon grains and surfaces of the silicon grains, and a second hole have an average of 100 nm or more and 300 nm or less present between the plurality of silicon grains, wherein the aspect ratio of a crystalline silicon grain is less than 10.

2 Claims, 15 Drawing Sheets

(51) Int. Cl.
    *C01B 33/02*      (2006.01)
    *B22F 1/00*      (2022.01)
    *B22F 1/054*      (2022.01)

(52) U.S. Cl.
    CPC ... *B22F 2301/255* (2013.01); *B22F 2304/054* (2013.01); *C01P 2004/03* (2013.01); *C01P 2004/04* (2013.01); *C01P 2004/62* (2013.01); *C01P 2004/64* (2013.01); *C01P 2006/32* (2013.01); *C01P 2006/40* (2013.01)

(56) References Cited

U.S. PATENT DOCUMENTS

| | | |
|---|---|---|
| 2014/0116491 A1 | 5/2014 | Reifenberg |
| 2017/0306445 A1 | 10/2017 | Yamamoto |
| 2018/0212131 A1 | 7/2018 | Kikuchi |
| 2018/0351069 A1 | 12/2018 | Boukai |

FOREIGN PATENT DOCUMENTS

| | | |
|---|---|---|
| JP | 2015053466 A | 3/2015 |
| JP | 2016504756 A | 2/2016 |
| JP | 2017017068 A | 1/2017 |
| JP | 2017195339 A | 10/2017 |
| JP | 2019506111 A | 2/2019 |
| WO | 2017057237 A1 | 4/2017 |

OTHER PUBLICATIONS

Lee. "Thermal conductivity anisotropy and grain structure in Ge2Sb2Te5 films." Journal of Applied Physics. 2011: 084902-1-084902-6. vol. 109. Cited in Specification.
Hochbaum. "Enhanced thermoelectric performance of rough silicon nanowires." Nature. Jan. 10, 2008: 163-167. vol. 451. Cited in Specification.
Kashwiagi. "Realization of low thermal conductivity bulk-scale nanostructured silicon by self-assembly method." Proceedings paper of 55th National Heat Transfer Symposium of Japan, May 22, 2018. Partial English machine translation provided.
Kashwiagi. "Realization of low thermal conductivity bulk-scale nanostructured silicon by self-assembly method." Presentation slides presented at 55th National Heat Transfer Symposium of Japan, May 31, 2018. Partial English machine translation provided.
Shiomi. "Controllability and designability of nanoscale thermal transport." Presentation slides presented at China-Japan Heat Transfer Symposium 2018, Jan. 19, 2018.
International Search Report issued in Intl. Appln. No. PCT/JP2018/047940 dated Mar. 26, 2019. English translation provided.
Written Opinion issued in Intl. Appln. No. PCT/JP2018/047940 dated Mar. 26, 2019. English translation provided.
Ohnishi. "Phonon Engineering of Thermoelectric Materials Using Nanostructured Interfaces." Ceramics. 2017: 75-77. vol. 52, No. 2. Cited in NPL 6 and NPL 7. Partial English machine translation provided.
Office Action issued in Japanese Appln. No. 2019-562126 dated Jul. 13, 2021. English machine translation provided.

\* cited by examiner

SILICON BULK THERMOELECTRIC CONVERSION MATERIAL

CROSS-REFERENCE TO RELATED APPLICATIONS

This application is based upon and claims the benefit of priority from the prior Japanese Patent Application No. 2017-249463, filed on Dec. 26, 2017, and PCT Application No. PCT/JP2018/047940, filed on Dec. 26, 2018, the entire contents of which are incorporated herein by reference.

FIELD

The present invention relates to a silicon bulk thermoelectric conversion material.

BACKGROUND

Recently, many researches aiming at performance improvement of thermoelectric conversion materials have been made. Thermoelectric conversion is a device that can directly mutually convert heat and electricity, and since it is possible to generate power from low-temperature heat sources such as waste heat, which has been difficult to utilize until now, it is attracting attention as an energy harvesting device including a power source such as an IoT sensing device. The performance of the thermoelectric conversion material is represented by the dimensionless figure of merit ZT.

[Expression 1]

$$ZT = \frac{S^2 \sigma}{\kappa} T \quad (1)$$

S is the Seebeck coefficient, σ is the electrical conductivity, T is the absolute temperature, and κ is the thermal conductivity. As is apparent from this equation, the performance of the thermoelectric conversion material can be improved by either (1) increasing the Seebeck coefficient S or the electrical conductivity σ, or (2) reducing the thermal conductivity κ.

In recent years, many research groups have reported research results with ZT significantly exceeding 1. On the other hand, when considering the use as the energy harvesting device, a significant improvement of ZT is not indispensable, and a high ZT is not necessarily required as long as the manufacturing cost can be kept low. However, most studies reported to date have used materials that are highly toxic and less environmentally compatible, as well as expensive. Therefore, the aforementioned cost-effectiveness problem cannot be solved, and the popularization and practical application of thermoelectric conversion devices have not been achieved. Here, from the viewpoint of manufacturing cost, silicon is a dominant material as the thermoelectric conversion material, because it is a material with high reserves, nontoxic, and high stability, and because silicon processing technology which is popular at present can be applied. However, the thermal conductivity of the silicon is 100 W/m/K or more, and even if it is simply made into the thermoelectric conversion material, the ZT value is about 0.005, which is not suitable for practical use at present state. Therefore, Japanese Laid-Open Patent Publication No. 2016-504756 attempts to reduce the thermal conductivity by using a nanowire having "an aspect ratio of 10 or more" (claim 1, paragraph [0009], etc.). Japanese Laid-Open Patent Publication No. 2015-053466 provides a solution to "a thermoelectric material comprising a porous material containing any of a magnesium silicon alloy, a magnesium silicon tin alloy, silicon, or a silicon germanium alloy as a main component and having a large number of fine pores." This means that the thermoelectric material is sought based on an alloy material (germanium or the like) because a practical ZT value cannot be obtained with an elemental silicon or a slightly doped silicon. Non-patent Literature 1: Allon I. Hochbaum et al. 10 Jan. 2008 Enhanced thermoelectric performance of rough silicon nanowires Nature 451, 163-167.

SUMMARY

Although the Japanese Laid-Open Patent Publication No. 2016-504756 is intended to reduce the thermal conductivity by nanowiring, characteristics will become greatly different in the longitudinal direction and its orthogonal direction of the wire, it is impossible for the form of bulk to obtain a good isotropic characteristic at the same level as the nanowire. As can be seen from the fact that the Japanese Laid-Open Patent Publication No. 2015-053466 is intended to reduce the thermal conductivity by the alloy, it does not lead to the creation of a practical thermoelectric conversion material in the elemental silicon. Accordingly, an object of the present invention is to provide the silicon bulk thermoelectric conversion material in which thermoelectric performance is improved by reducing the thermal conductivity as compared with the prior art.

In one embodiment of the present invention, adjusting the structure of a silicon grain in a silicon bulk provides the silicon bulk thermoelectric conversion material in which the ZT is greater than 0.2 at room temperature with the elemental silicon (where "elemental" as defined herein, is meant to allow for the retention of minor impurities).

In one embodiment of the present invention, the silicon bulk thermoelectric conversion material is provided having a plurality of silicon grains having an average size of 1 nm or more and 300 nm or less, first holes having an average size of 1 nm or more and 30 nm or less present in the plurality of silicon grains and on the surfaces of the silicon grains, and second holes having an average size of 100 nm or more and 300 nm or less present between the plurality of silicon grains, wherein the aspect ratio of a crystalline silicon grain is less than 10.

In an embodiment of the present invention, a silver grain having an average of 1 nm or more and 30 nm or less may be included.

In one embodiment of the present invention, a ratio of the ZT between in-plane direction of the silicon bulk thermoelectric conversion material (direction vertical to the sample surface) and out-of-plane direction (direction parallel to the sample surface) may be below two.

In one embodiment of the present invention, the elastic modulus of the silicon bulk thermoelectric conversion material may be 30 GPa or less.

DESCRIPTION OF EMBODIMENTS

Figure 1A:
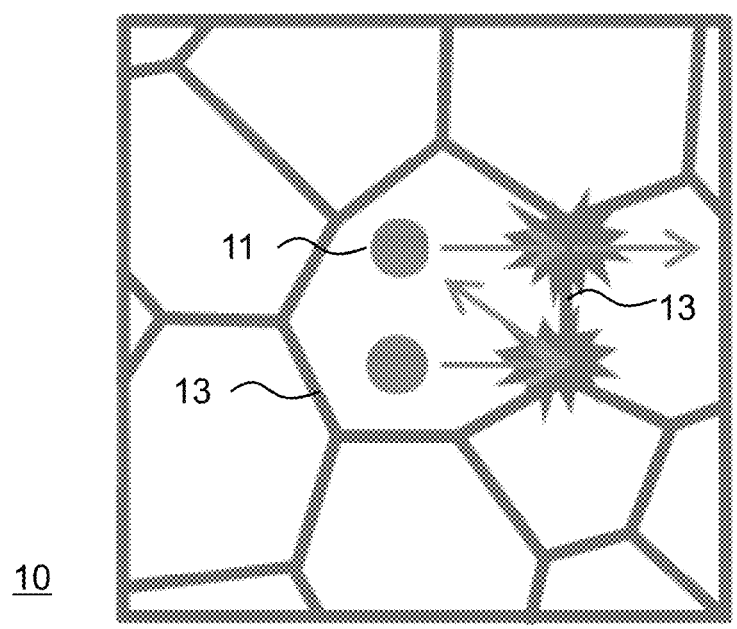
FIG. 1A is a diagram schematically showing a phonon transport in nanocrystalline structure.

Embodiments of the present invention will be described below with reference to FIGS. 1A to 15. However, the present invention can be implemented in many different modes and should not be construed as being limited to the description of the following embodiments. In addition, although the drawings may schematically represent the width, thickness, shape, and the like of each portion as compared with actual aspect for the sake of clarity of description, the drawings are merely an example and do not limit the interpretation of the present invention. In this specification and each drawing, the same reference numerals are assigned to the same elements as those previously described with reference to the preceding drawings, and detailed description thereof may be omitted as appropriate. In this specification, when a member or a region is "above (or below)" another member or region, unless otherwise limited, this includes not only being directly above (or below) another member or region, but also being above (or below) another member or region, i.e., including another component in between the above (or below) another member or region.

[Concept by the Present Inventors]

Figure 1B:
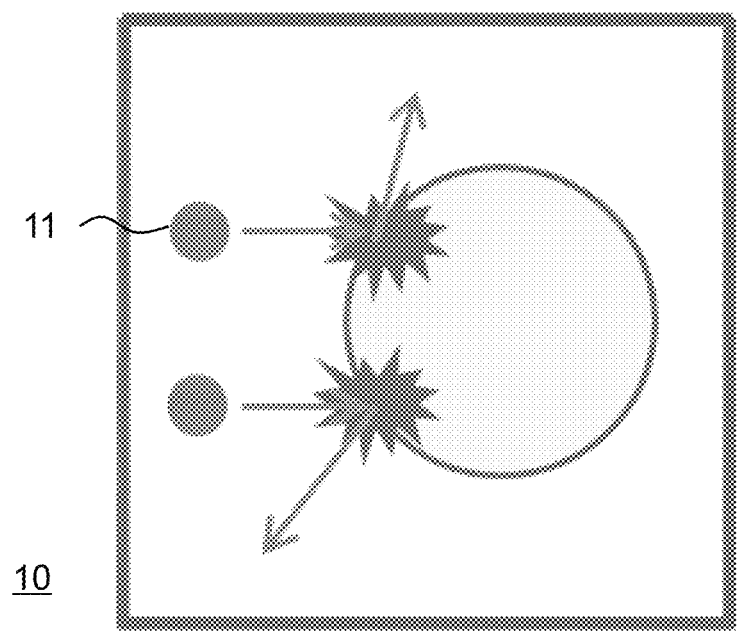
FIG. 1B is a diagram schematically showing a phonon transport in nano-porous structure.

In the practical application of the bulk silicon thermoelectric material, the present inventors have come to complete the present application by focusing on nanocrystalline structure. As shown in FIG. 1A, in nanocrystalline structure, when phonons 11 collide with a grain interface 13, some phonons are scattered, and some phonons are transmitted. On the other hand, as shown in FIG. 1B, all the phonons colliding with the pore surface are scattered in nano-porous structure. Therefore, it is considered that the use of nano-porous structure can promote the scattering of phonons than nanocrystalline structure and can reduce the thermal conductivity without alloying or forming nanowire structure. Furthermore, the combination of nano-porous structure and nanocrystalline structure can significantly reduce the thermal conductivity more than ever before.

[Constitution of the Present Invention]

Figure 2:
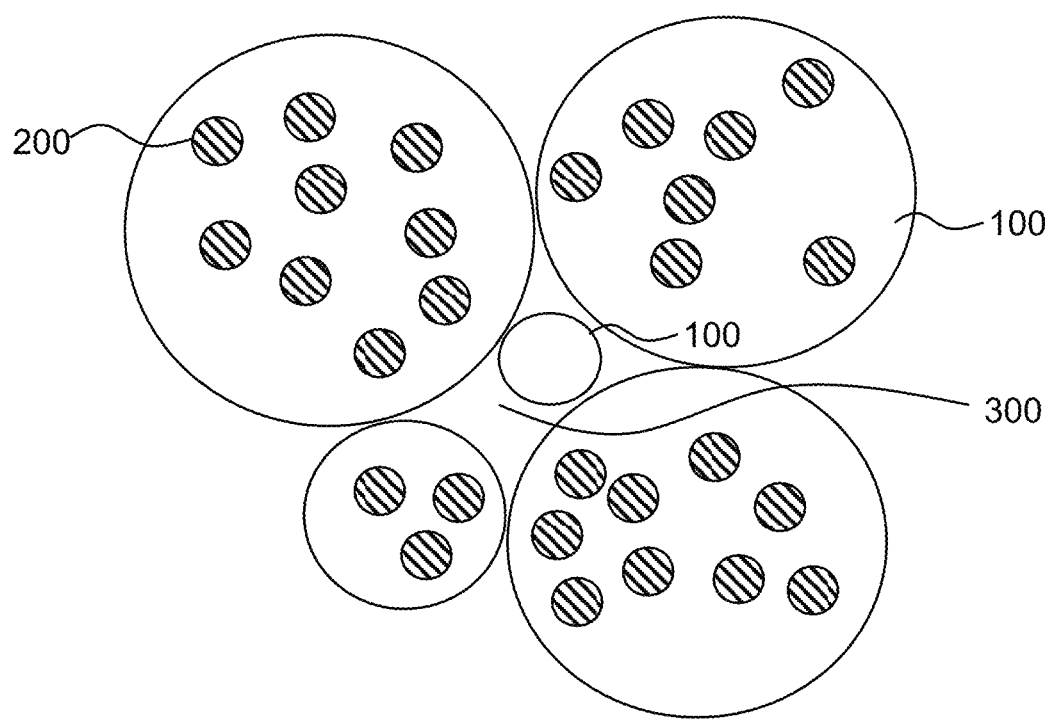
FIG. 2 is a schematic diagram showing a silicon bulk thermoelectric conversion material according to an embodiment of the present invention.

FIG. 2 is a schematic diagram showing a structure of the silicon bulk thermoelectric conversion material according to an embodiment of the present invention. Specifically, it was found that a significant thermal conductivity reduction can be achieved by nano-porous structure appropriately controlling silicon grains 100, first holes 200 present in the silicon grains and the silicon grain surfaces, and second holes 300 present between the silicon grains. Note that in this specification, "bulk" means that the anisotropy between out-of-plane direction and in-plane direction is small (specifically, the ratio of ZTs is below two).

[Silicon Grain 100]

In the present embodiment, the silicon grains 100 have an average size of 1 nm or more and 300 nm or less. There are two or more silicon grains. The silicon grains 100 having an average of 1 nm or more and 300 nm or less mean that the average value of the sizes of the silicon grains 100 (for example, its diameter if it is circular, the diameter of the circle circumscribing the polygon if it is polygonal) is 1 nm or more and 300 nm or less. The average value of the sizes of the silicon grains 100 is not to be understood as the average value in the whole broad distribution, but as a grain size which is the largest frequency of the main grain size constituting the peak. In the present invention, the silicon grains 100 of the average 1 nm or more and 300 nm or less mean a value obtained by averaging the sizes of the silicon grains 100 that can be detected when observing a predetermined observation region with an area of 0.65 µm² at HAADF-STEM (magnification 200000 times). This observation method can be substituted by another observation method if such another observation method can accomplish a wider observation region and higher resolution than this observation method, including the observation condition in the following section. The particle size distribution of the silicon grains 100 is preferably broad or has two peaks of a small particle size and a large particle size. By having such a particle size distribution, since the phonon is more scattered, it is possible to reduce the thermal conductivity.

[Holes 200 (First Holes)]

The holes 200 (first holes) are also present on the surface of the silicon grain. The holes 200 (first holes) may also be present in the silicon grain. Incidentally, the holes 200 (first holes) may also be present in the silicon grain, as will be described later, in an embodiment of the present invention, etching is also performed on the transverse direction of the nano-wire array structure by silver grain at the stage of the nano-wire array structure, and it is inferred that there is a hole-derived space in silicon grain by plugging during sintering. The first holes 200 have an average size of 1 nm or more and 30 nm or less, preferably an average size of 1 nm or more and 10 nm or less. The holes having an average of 1 nm or more and 30 nm or less means that the average of opening sizes of the holes (e.g., the diameter of a circle if it is circular, or the diameter of a circle circumscribing the polygon if it is polygonal) is 1 nm or more and 30 nm or less. Here, the average value of the sizes of the first holes 200 is not to be understood as the average value in the entire broad distribution, but as the size of opening which is the largest frequency of opening sizes of the main holes constituting the peak. In the present invention, holes having an average of 1 nm to 30 nm mean a value obtained by averaging the sizes of the holes that can be detected when observing a predetermined observation region with an area of 0.65 $\mu m^2$ at High-Angle Annular Dark Field Scanning TEM (HAADF-STEM (200000 magnification). Here, the size of the first hole 200 is an average value obtained by detecting the first holes 200 using an image analysis software (Asahi Kasei Engineering Co., Ltd., A-zo Kun (registered trademark)) with the image of the observed region, and measuring and averaging the sizes of the detected openings of the first holes 200.

[Holes 300 (Second Holes)]

Between the silicon grains, the holes 300 (second holes) exists. The holes 300 (second holes) have an average size of 100 nm or more and 300 nm or less. The holes having an average of 100 nm or more and 300 nm or less mean that the average value of the sizes of openings of the holes (for example, its diameter if it is circular, the diameter of a circle circumscribing the polygon in question if it is polygonal) is 100 nm or more and 300 nm or less. Here, the average value of the sizes of the second holes 300 is not to be understood as the average value in the entire broad distribution, but as the size of the opening which is the largest frequency of opening sizes of the main holes constituting the peak. In the present invention, the holes having the average 100 nm or more and 300 nm or less mean a value obtained by taking the average of the sizes of the holes that can be detected when observing a predetermined observation region with an area of 60 $\mu m^2$ at HAADF-STEM (20000 magnification). Here, the second hole 300 was sized by detecting the second holes 300 using the image analysis software described above for the image of the observation region, and removing the region of the second holes 300 detected from the image of the observation region to determine a silicon grain interface. From the determined interface of the silicon grains, the sizes of the openings of the second holes 300 are measured and averaged. Having such a hierarchical nano-porous structure between the first holes and the second holes is the key to achieving even greater reductions in thermal conductivity than the conventional nanostructured materials. In addition, if hierarchical structures similar to those of the holes are adopted for the silicon grain size, the characteristics can be further improved.

[Crystalline Silicon Grain Aspect Ratio]

The aspect ratio of the crystalline silicon grain is less than 10, preferably less than 3. The aspect ratio refers to the ratio of the long side to the short side in a rectangle for the sake of clarity, but in this specification, the aspect ratio is not limited to a rectangle, but is also considered in the case of a circle or a polygon, and the aspect ratio is calculated by the ratio of the long axis and the short axis of a rectangle circumscribing the crystalline silicon grain. This aspect ratio constraint is an important factor in achieving isotropic and good properties in bulk form.

[Properties of the Silicon Bulk Thermoelectric Conversion Material]

The silicon bulk thermoelectric conversion material having the above-described structure can realize the characteristics that the ZT of the elemental silicon exceeds 0.2 at room temperature. Elemental silicon means that it is not an alloy, although it allows a small amount of impurities to remain.

Although the silicon bulk thermoelectric conversion material with the above structure has been found that the ZT of the elemental silicon exceeds 0.2 at room temperature, it is possible to further improve the ZT by adjusting the quantity of dopant into the silicon.

The silicon bulk thermoelectric conversion material having the above-described structure can achieve ZT=0.2, although its electron field-effect mobility is less than or equal to half of a silicon substrate, specifically, less than or equal to 33 $cm^2Ns$. Since all thermoelectric materials practically used so far are degenerate semiconductors with high mobility and multivalley, it can be seen that the silicon bulk thermoelectric conversion material with the above structure has a practical thermoelectric performance of ZT=0.2 or more with lower mobility. In addition, the silicon bulk thermoelectric conversion material with the above structure can achieve ZT=0.2 despite the value of an electron carrier concentration $6 \times 10^{18}$ $cm^{-3}$ or less.

Here, in a bulk single crystal, the mean free path of each phonon is determined by phonon-phonon scattering. Effective thermal conductivity can be reduced from that of the bulk single crystal by providing the interface and surface at intervals shorter than the mean free path. In the silicon bulk thermoelectric conversion material according to the present invention having a structure in which the silicon grains 100 in which the first hole 200 is present in the silicon grain and on the surface of the silicon grain are sintered and joined at the grain boundaries, the silicon grains 100, the first holes 200 and the second holes 300 show the action of providing the interface or the surface in the bulk thermoelectric conversion material at intervals shorter than the mean free path.

If the size of grain is sufficiently larger than the phonon mean free path, the thermal conductivity within the grain can be considered the same as that of the single crystal because the phonon is scattered to other phonons prior to reaching the interface (diffused phonon transport). On the other hand, if the size of grain is sufficiently smaller than the phonon mean free path, the mean free path is limited by the particle size and the thermal conductivity within the grain becomes smaller than that of the single crystal because the phonon is scattered by the interface without being scattered by the other phonons (ballistic phonon transport). Also, since the mean free path of electrons in a semiconductor is generally smaller than that of phonon, keeping the particle size larger than the mean free path of an electron can selectively inhibit the transport of the phonon and reduce the thermal conductivity without sacrificing electrical conduction as well.

Figure 3:
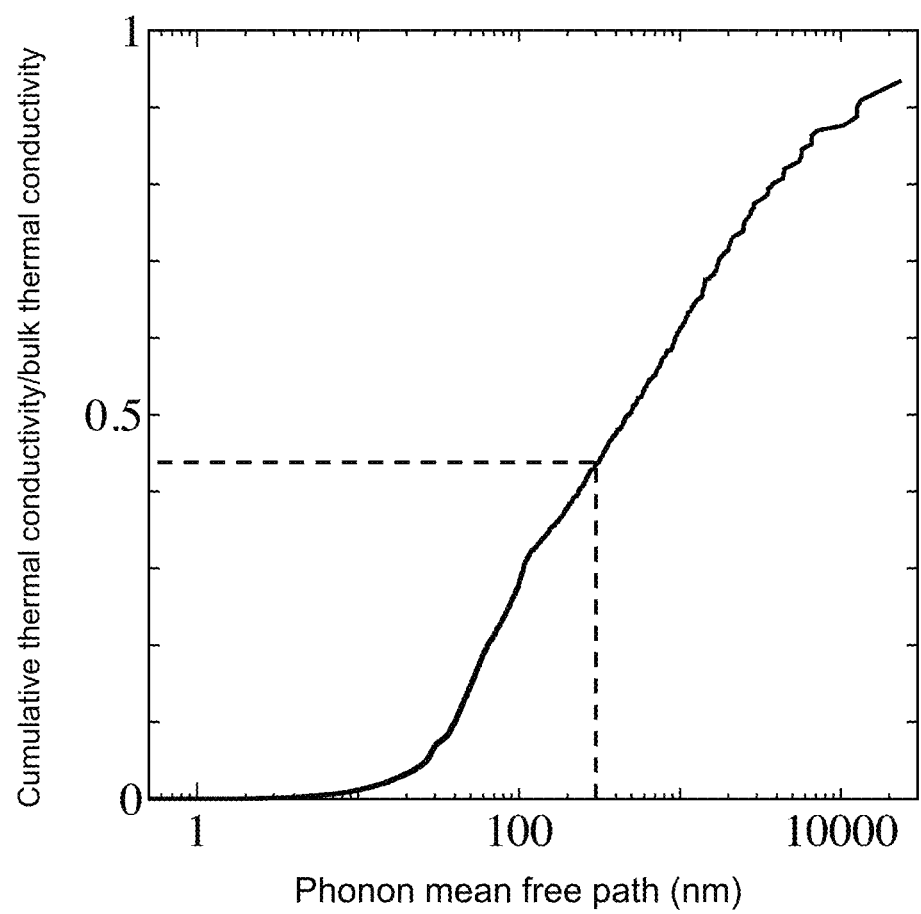
FIG. 3 is a diagram showing the cumulative thermal conductivity/bulk thermal conductivity for a phonon mean free path in a silicon material.

FIG. 3 is a diagram showing the cumulative thermal conductivity/bulk thermal conductivity for the phonon mean free path in the silicon material. As is evident from FIG. 3, when the phonon mean free path exceeds 300 nm, the thermal conduction is reduced only to 50%. On the other hand, in the silicon bulk thermoelectric conversion material according to an embodiment of the present invention, the silicon grains 100 have an average size of 1 nm or more and 300 nm or less, the first holes 200 have an average size of 1 nm or more and 30 nm or less, and the second holes 300 have an average size of 100 nm or more and 300 nm or less, the thermal conductivity is greatly reduced than 50%.

A different inner structure can also reduce the phonon transport in different frequency bands. Furthermore, in practice, the mean free path of phonon varies greatly depending on the mode of phonon (frequency, wave number, and polarization), so that a "quasi-ballistic transport" in which diffused phonons and ballistic phonons are mixed. Therefore, such strong multiscalability must be considered when considering the heat transport of the silicon bulk thermoelectric conversion material from the viewpoint of phonon transport. This means that the proper length scale of the structure differs depending on the mode in reducing the heat transport. The silicon bulk thermoelectric conversion material according to the embodiment of the present invention can control a wide range of modes because the silicon bulk thermoelectric conversion material is a material having a multi-scale structure in which the silicon grains 100 have an average size of 1 nm or more and 300 nm or less, the first holes 200 have an average size of 1 nm or more and 30 nm or less, and the second holes 300 have an average size of 100 nm or more and 300 nm or less.

[Metal Particle 23]

Figure 4:
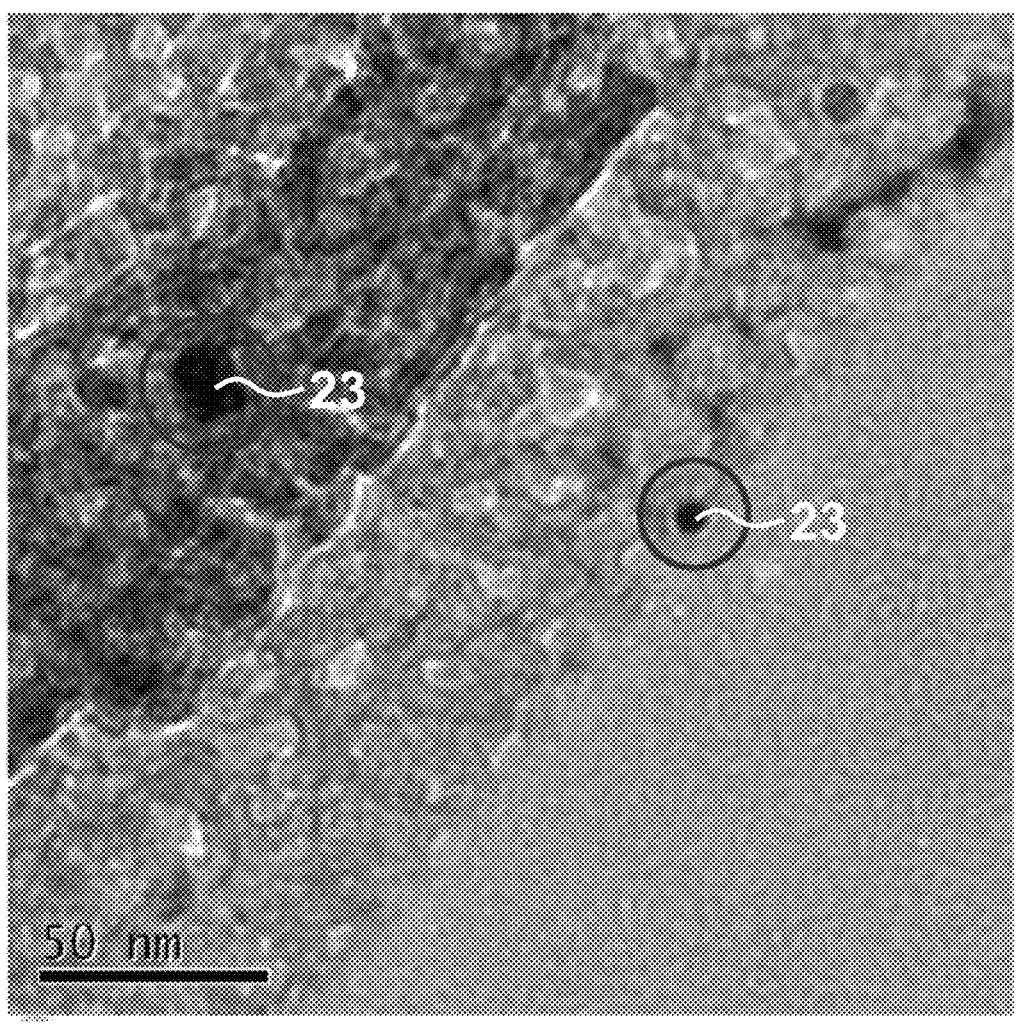
FIG. 4 is a photograph (TEM) showing a metal particle 23 in a silicon bulk thermoelectric conversion material according to an embodiment of the present invention.

In one embodiment of the present invention, a metal particle 23 (e.g., silver grain) having an average size of 1 nm or more and 30 nm or less may be further included (FIG. 4). The metal particles 23 (the silver grains used in the etch for the nano-wire array structure production described below in the embodiment) exist in, on the surface of, and between the silicon grains, and ZT is improved and the thermal conductivity is lowered in accordance with the conventional knowledge that the thermal conductivity may be lowered when a heavy element is mixed into silicon as an impurity. Further, when the silver grains are used as the metal particles 23 in the manufacturing process, there is an advantage that the silver grains remain in, on the surface of, and between the silicon grains without any special steps.

[Mechanical Property]

In one embodiment of the present invention, the silicon bulk thermoelectric conversion material having the above structure has the elastic modulus of 30 GPa or less. Preferably, the elastic modulus of the silicon bulk thermoelectric conversion material may be 20 GPa or more and 30 GPa or less. In this specification, the elastic modulus of the silicon bulk thermoelectric conversion material shall be measured by the nanoindentation method. Since the silicon bulk thermoelectric conversion material of the present embodiment has small elastic modulus, it is inferred that the interface of the crystalline silicon grain has a soft structure as compared with the single-crystal silicon. In the silicon bulk thermoelectric conversion material of the present embodiment, it is inferred that the interface of the soft crystalline silicon grain reduces the transmission of phonons at the interface of the crystalline silicon grain, thereby reducing the thermal conductivity.

From the above, in the silicon bulk thermoelectric conversion material according to the embodiment of the present invention, since the silicon grains 100, the first holes 200 and the second holes 300 have a size of 300 nm or less, the thermal conductivity is greatly reduced than 50%. Further, since the silicon bulk thermoelectric conversion material according to the embodiment of the present invention is the material having a multi-scale structure in which the silicon grains 100 have an average size of 1 nm or more and 300 nm or less, the first holes 200 have an average size of 1 nm or more and 30 nm or less, and the second holes 300 have an average size of 100 nm or more and 300 nm or less, the phonon transportation can be reduced by controlling a wide range of phonon modes. Furthermore, since the silicon bulk thermoelectric conversion material according to the embodiment of the present invention has the structure in which the interface of the crystalline silicon grain is softer than that of the single crystal silicon, it is inferred that the transmission of phonons at the interface of the crystalline silicon grain is reduced and the thermal conductivity is reduced.

[Manufacturing Method]

Figure 5:
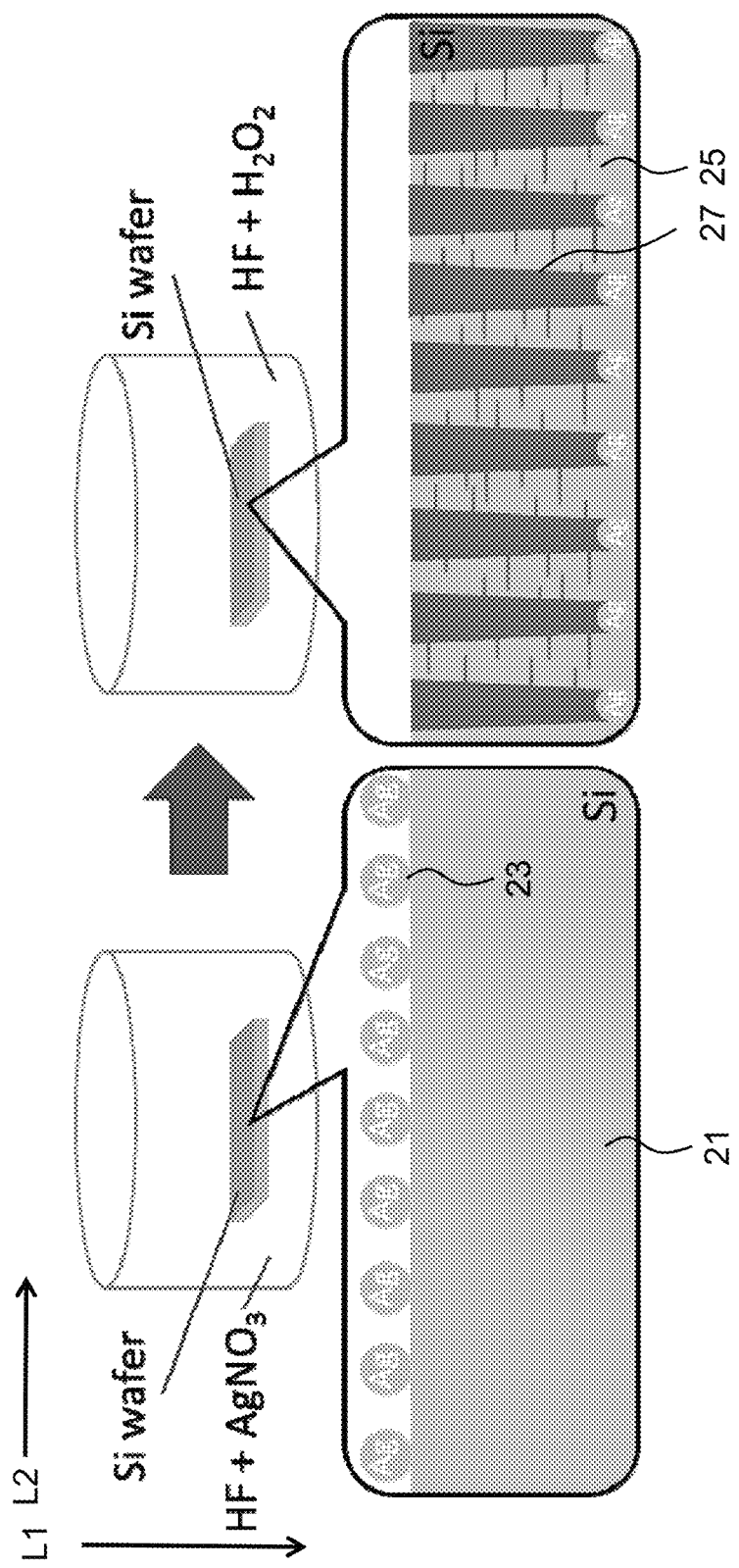
FIG. 5 is a schematic diagram showing a process for manufacturing a silicon bulk thermoelectric conversion material according to an embodiment of the present invention.

Any silicon substrate 21 is provided to form a nano-wire array structure 25 using metal assisted etching with the metal particles 23 for the substrate. FIG. 5 is a schematic view of the nanostructure-forming process by metal-assisted etching. Metal-assisted etching is a technique in which metal dots of gold, silver, or the like are formed on silicon, and the silicon is selectively etched by an acidic solution such as HF using the metal dots as a catalyst.

In the present embodiment, gold, silver, platinum, palladium, or the like can be used as a metal used in metal-assisted etching by a metal particle catalysis, but silver is particularly preferable in terms of conductivity and costs. In FIG. 5, the silver grains are exemplarily referred to as the metal particles 23. Etching is selectively performed in the L1 direction.

Figure 8:
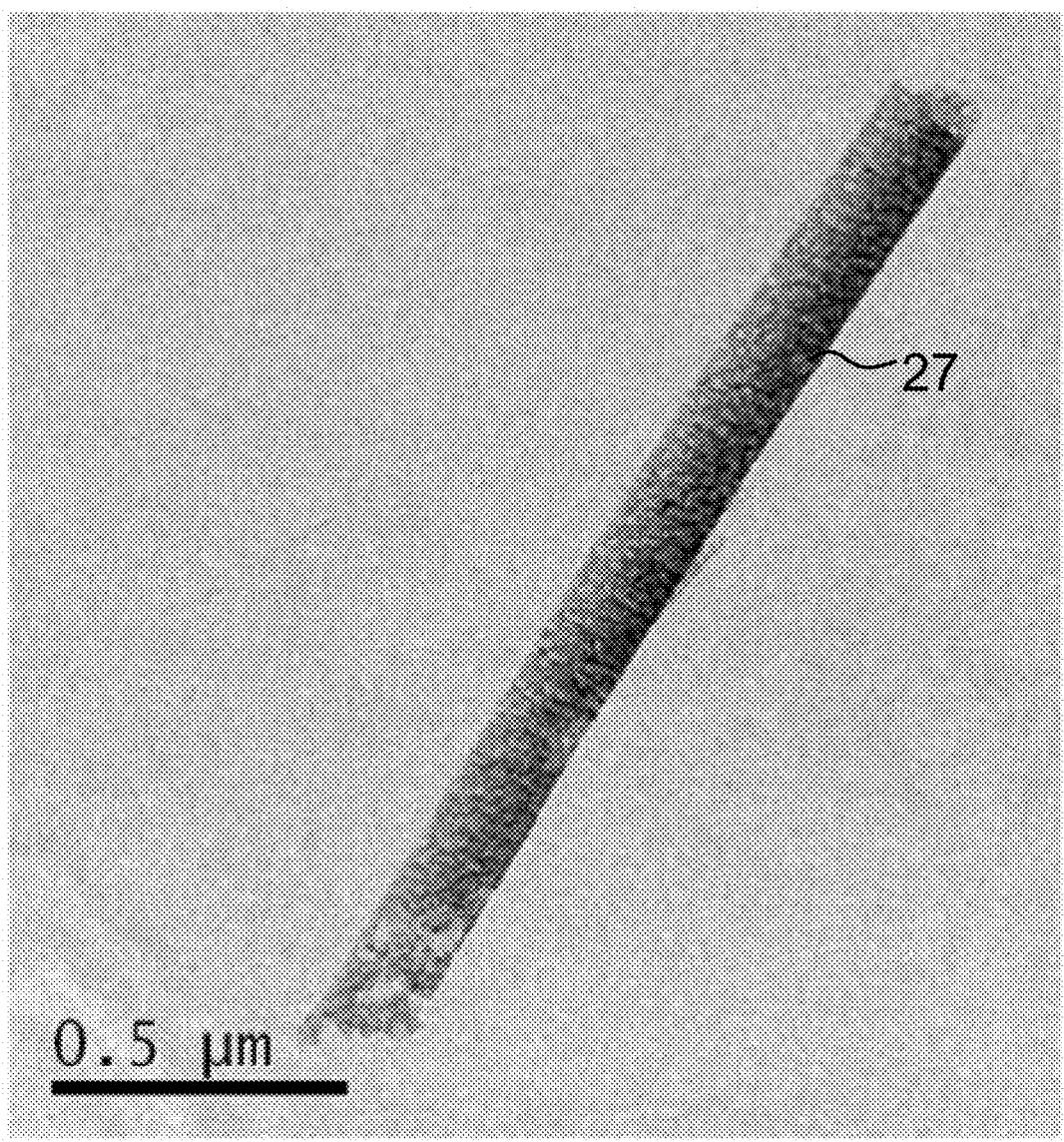
FIG. 8 is a photograph (TEM) showing a hole 27 occurring in the fabrication of a silicon bulk thermoelectric conversion material according to an embodiment of the present invention.
Figure 9:
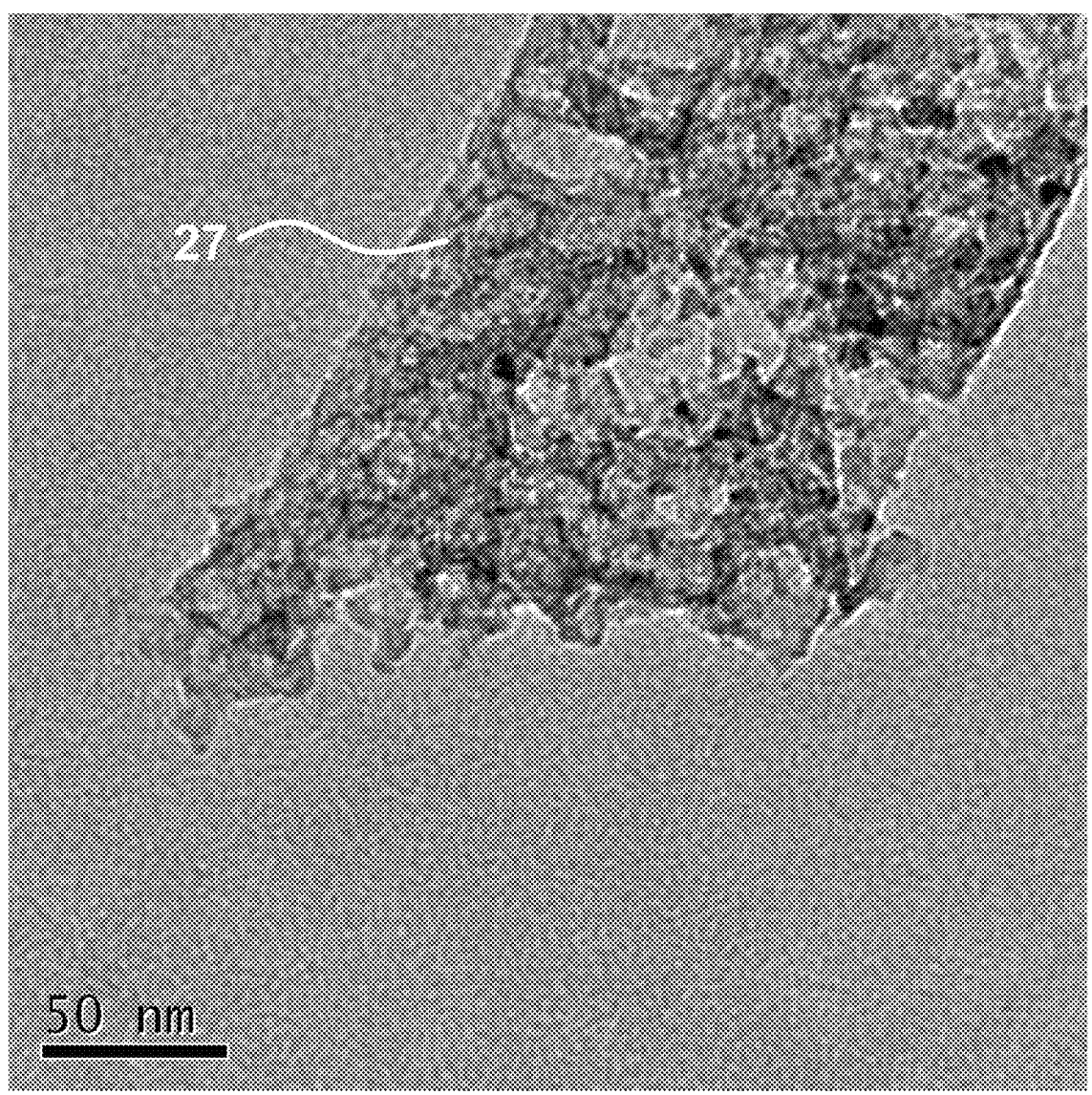
FIG. 9 is a photograph (TEM) showing a hole 27 occurring in the manufacturing a silicon bulk thermoelectric conversion material according to an embodiment of the present-invention.

Then, the nano-wire array structure 25 has holes 27 in a direction intersecting the L1 direction (e.g., a direction substantially parallel to the substrate surface, such as the L2 direction) (FIG. 5). The holes 27 are not necessarily limited to the L2 direction as long as it intersects the L1 direction. FIGS. 8 and 9 show the actual holes 27.

In one embodiment of the present invention, the nano-wire array structure can be refined by applying pressure and crushing along the holes 27. By crashing the nano-wire array structure during the pressurization process, a fine grain with a low-aspect-ratio can be obtained. Incidentally, the pressurization process is preferably performed from a direction substantially parallel to the substrate surface (L2 direction), i.e., the direction of the end of the nano-wire array structure in order to promote refinement. Sintered by plasma-sintering together with such a pressurization process, it is possible to form the silicon bulk thermoelectric conversion material having a special fine shape having the features described with reference to FIG. 2.

Figure 6:
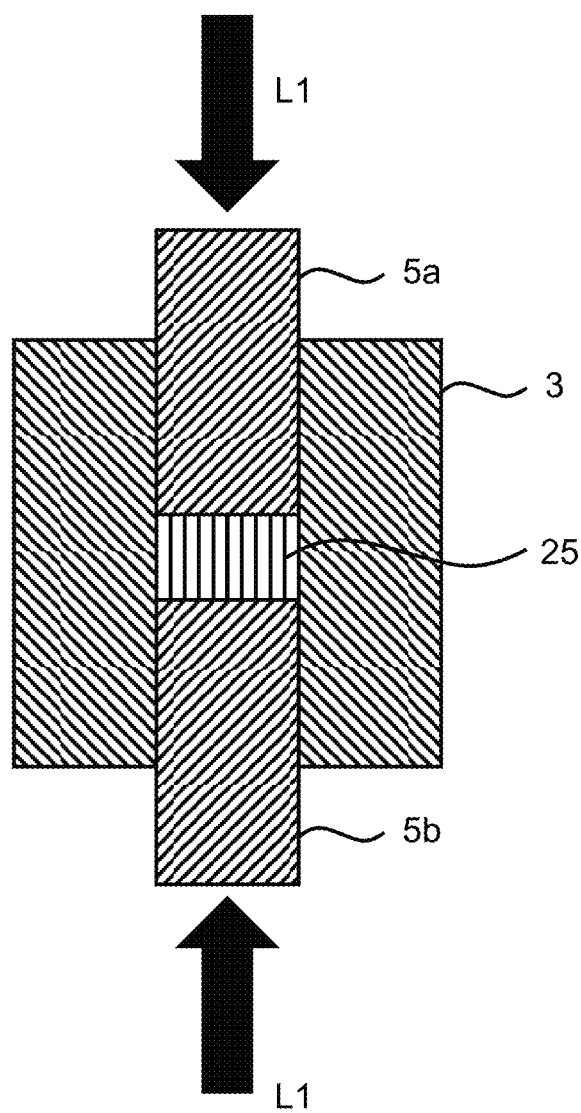
FIG. 6 is a schematic diagram of a discharge plasma sintering device 1 of an embodiment of the present invention.

In the present embodiment, the process of pressurizing and plasma-sintering can be performed by using, for example, the discharge plasma sintering device 1 shown in FIG. 6. The spark plasma sintering device 1 includes, for example, a cylindrical die 3, and a cylindrical first punch electrode 5a and a second punch electrode 5b movable in the vertical direction (L1 direction) and arranged in contact with interior of the die 3. The first punch electrode 5a and the second punch electrode 5b are arranged inside of the die 3 so as to face each other in the L1 direction. The nano-wire array structure 25 is accommodated in the space surrounded by the die 3, the first punch electrode 5a, and the second punch electrode 5*b*. Here, the nano-wire array structure 25 is accommodated within the die 3 so as to be oriented in the L1 direction.

In one embodiment, the process of pressurizing and plasma sintering is carried out by setting the sample temperature (the temperature of the nano-wire array structure 25 or the internal temperature of the die 3) to 800° C. or more and 1000° C. or less by electrical heating, and setting the pressure to 50 MPa or more and 200 MPa or less at the time of pressurization in the L1 direction by the first punch electrode 5*a* and the second punch electrode 5*b*. Conventionally, it has been subjected to plasma sintering by measuring the surface temperature of the outside of the die 3. In the present embodiment, the uniformity of the sintering temperature in the sample can be increased by controlling the sample temperature in the range of 800° C. or more and 1000° C. or less, and it is possible to produce the silicon bulk thermoelectric conversion material in which the ZT exceeds 0.2 at room temperature as a result. Note that when the sample temperature is less than 800° C., the porosity in the sample increases and a sintered body cannot be obtained. On the other hand, when the sample temperature exceeds 1000° C., the silicon constituting the nano-wire array structure 25 is melted, and the first holes 200 of the surfaces of the silicon grains 100 and the second holes 300 between the silicon grains is reduced or disappeared, it is impossible to obtain the silicon bulk thermoelectric conversion material in which the ZT at room temperature exceeds 0.2 according to the present invention. Incidentally, time required for the process of pressurizing and plasma sintering is dependent on the quantity of the nano-wire array structure 25 to be filled, it is preferable to perform the process for 1 minute or more and 10 minutes or less.

In the present embodiment, it is preferable to perform plasma-sintering of 2-mode. The plasma-sintering of 2-mode is a method in which an alternating current is supplied in an early stage of pressurization to the nano-wire array structure 25 by the first punch electrode 5*a* and the second punch electrode 5*b*, and thereafter, a direct current is supplied for the sintering. Further, it is preferable to stop supplying direct current and stop heating when the pressurization of the nano-wire array structure 25 by the first punch electrode 5*a* and the second punch electrode 5*b* is completed, that is, when sintering of the crushed nano-wire array structure 25 progresses and compression does not proceed.

[Variation of the Manufacturing Method]

Figure 7:
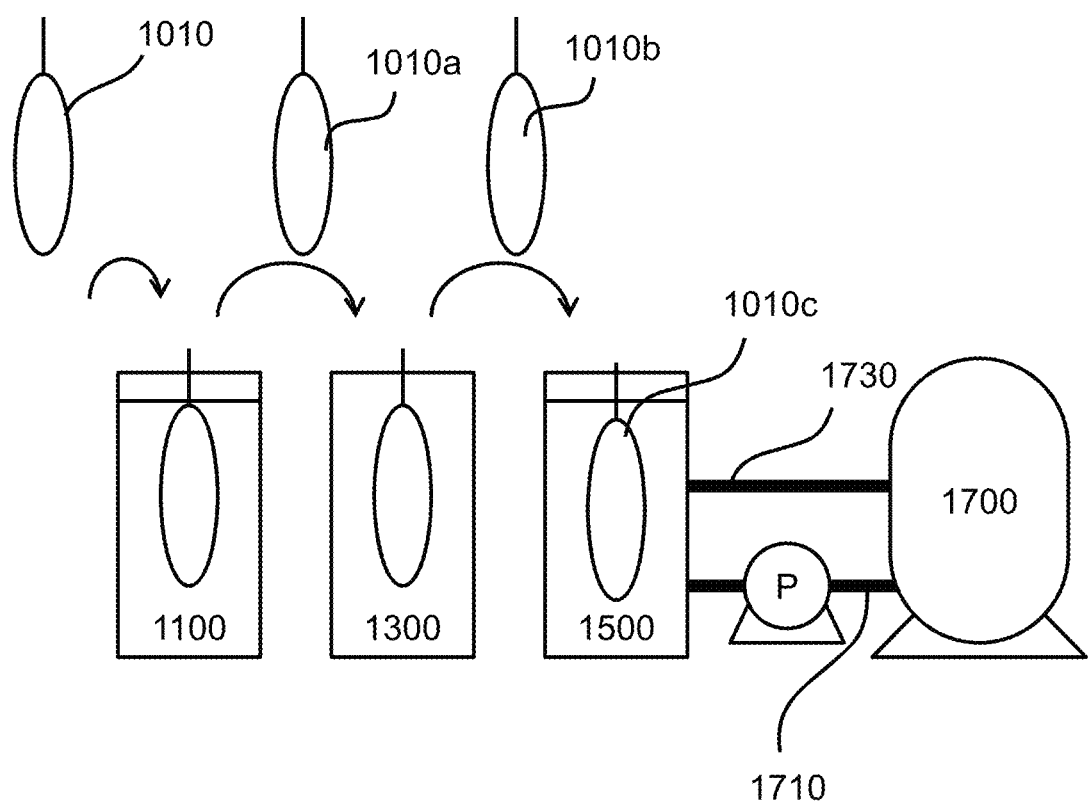
FIG. 7 is a schematic diagram of a manufacturing device 1000 of an embodiment of the present invention.

In the manufacturing method of the silicon bulk thermoelectric conversion material described above, a method of manufacturing the nano-wire array structure 25 by etching from one surface of the silicon substrate 21. As a variation, an example of a mass production technique of the silicon bulk thermoelectric conversion material will be described. FIG. 7 is a schematic diagram of the manufacturing device 1000 according to an embodiment of the present invention. The manufacturing device 1000 includes, for example, but not limited to, an oxide film removing tank 1100, a metal particle growth tank 1300, and an etching tank 1500. The manufacturing device 1000 preferably comprises a reservoir tank 1700 which connects to the etching tank 1500 via a pipe 1710 and a pipe 1730.

The oxide film removing tank 1100 may accommodate an acidic solution containing HF or the like and may remove an oxide layer formed on the surface of a silicon substrate 1010. The metal particle growth tank 1300 accommodates acidic solutions containing a metallic ion, and the metal particle can be grown on the surface of a silicon substrate 1010*a* from which the oxide film has been removed. Note that a metal constituting the metallic ion can be selected from the same metal as the metal of the above-described manufacturing method, and detailed description thereof is omitted. The etching tank 1500 accommodates an etchant and allows metal assisted etching to proceed with a silicon substrate 1010*b* with the metal particle attached to the surface. Incidentally, as the etchant, for example, it is possible to use a solution including, but not limited to, HF and $H_2O_2$.

In this variation, in the etching tank 1500, the etching proceeds from both sides of the two main surfaces of the silicon substrate 1010*b*. Therefore, in this variation, the holes 27 penetrating in the plane direction (L1 direction) of the silicon substrate 1010*b* is formed, it is possible to form nano-wire array structure 25 extending from one surface (first surface) of the silicon substrate 1010*b* to the other surface (second surface). It should be noted that the nano-wire array structure 25 produced in the present variation are not separated by the van der Waals force, and a nano-wire array structure aggregate 1010*c* in which the silicon substrate shapes are maintained can be obtained.

Further, since the pump P is disposed in the pipe 1710, the etchant is continuously or intermittently supplied from the reservoir tank 1700 to the etching tank 1500. As a result, the etchant concentration in the etching tank 1500 in the etching process can be kept substantially constant. Therefore, in the present variation, the etching rate is maintained substantially constant, and consequently, it is possible to implement a continuous etching process, for example, to operate for 24 hours or to shorten the etching time.

EXAMPLES

In Example 1, a silver was used as a catalyst metal for metal assisted etching. Electroless plating was used as a method for forming silver dots. A more specific experimental method will be described below. In this experiment, first, a cleaned silicon wafer was immersed in a mixed solution of 0.01 M of $AgNO_3$ and 4.8 M of HF for 1 minute to form high-density silver dots on the surface of the silicon wafer. Next, the silicon wafer having the high-density silver dots formed on its surface was immersed in a mixed solution of 0.2 M of $H_2O_2$ and 4.8 M of HF for 2 hours to perform metal assisted etching, whereby a nano-wire array structure having a hole substantially parallel to the substrate surface was produced on the surface of the silicon wafer. In this Example 1, it was attempted to form the silicon bulk thermoelectric conversion material having a special fine shape having the features described with reference to FIG. 2, in the prepared nano-wire array structure silicon, using a plasma high-speed spark sintering apparatus (manufactured by Elenix Inc., Ed-Pas IV), by controlling the current so as to 980° C. of the sample temperature, while pressurizing at 50 MPa, pulverizing and refining the nano-wire array structure along the holes 27, and sintering and crushing for 3 minutes.

[Structural Evaluation of Manufactured Nanostructure]

Figure 10:
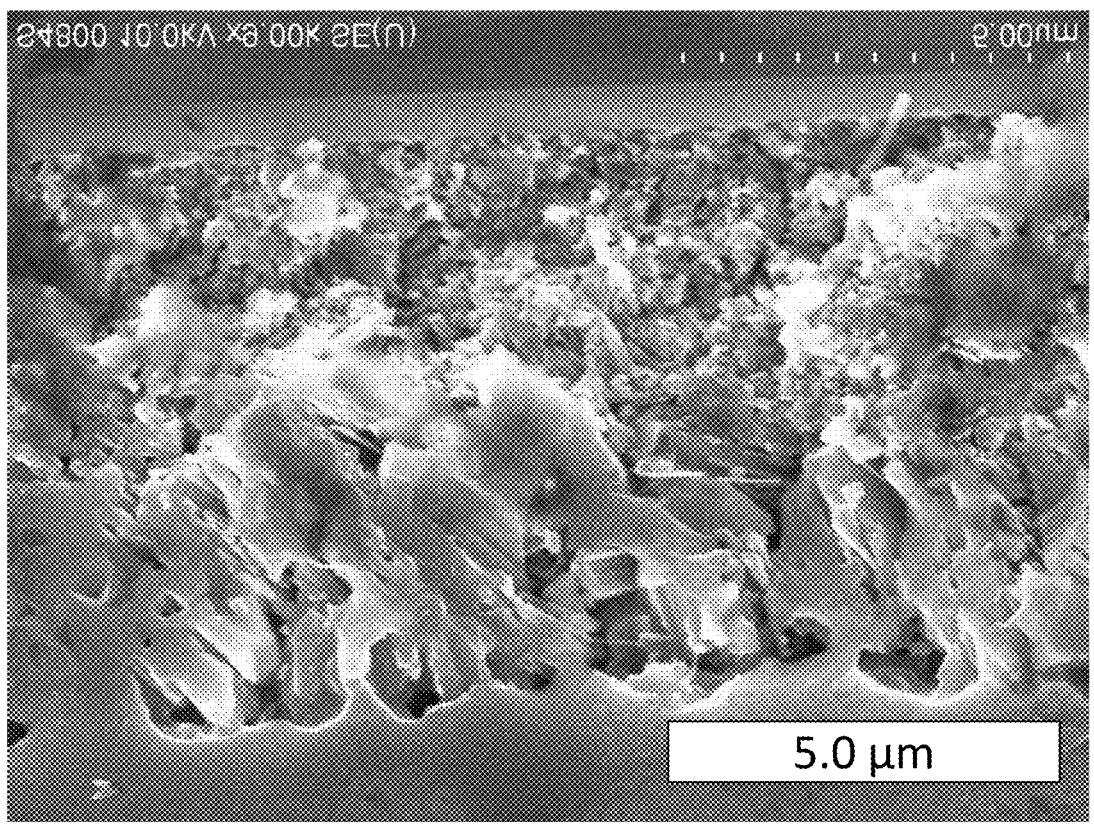
FIG. 10 is an SEM photograph of a silicon bulk thermoelectric conversion material according to an example of the present invention.
Figure 10:
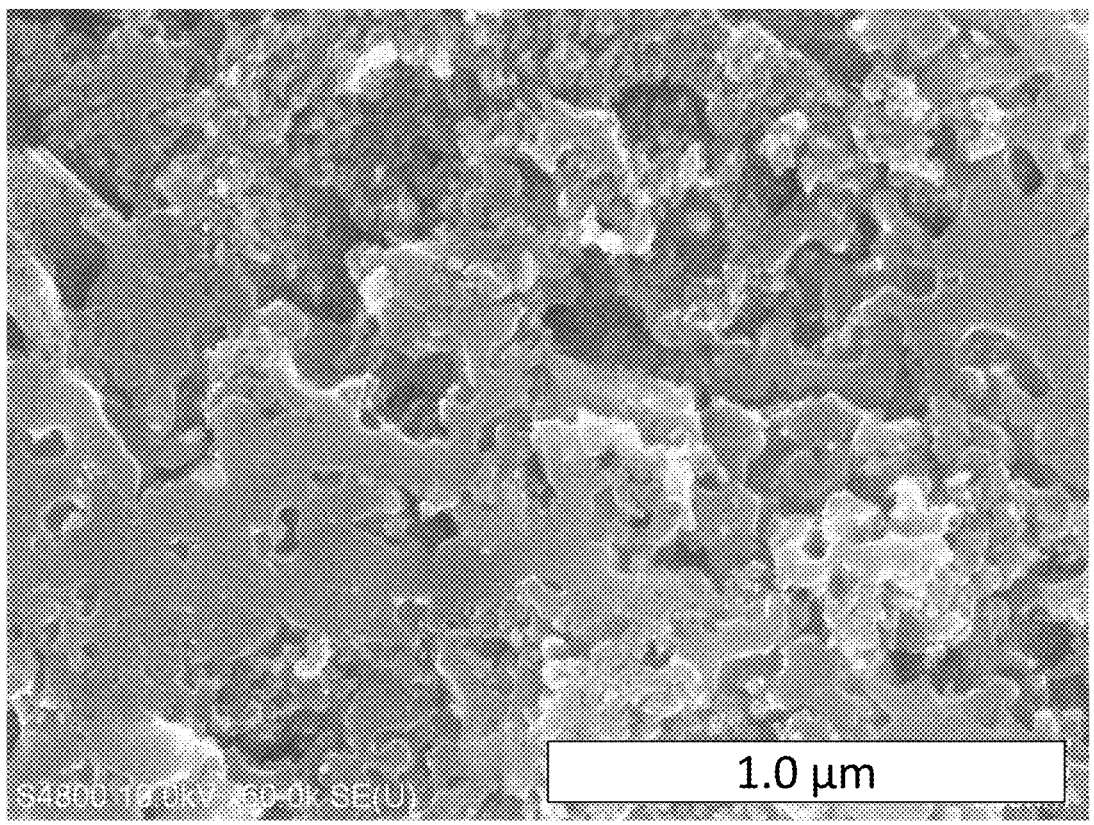
Figure 11A:
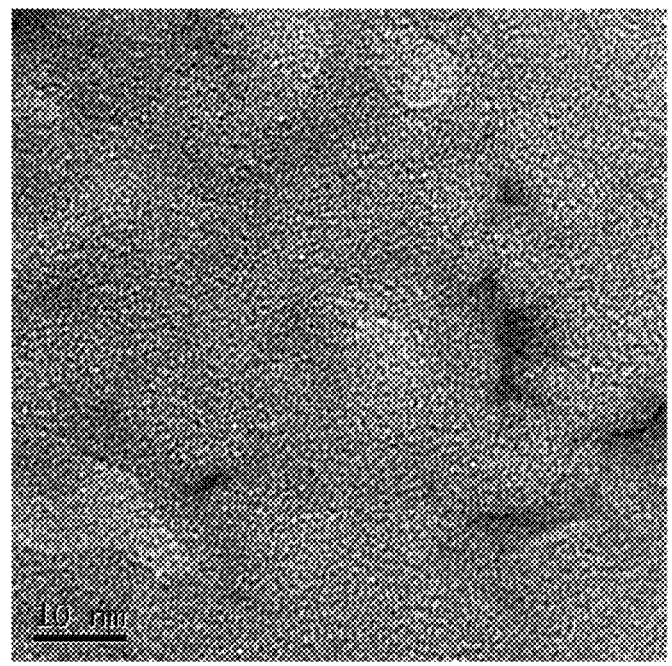
FIG. 11A is a TEM photograph of a silicon bulk thermoelectric conversion material according to an embodiment of the present invention.
Figure 11B:
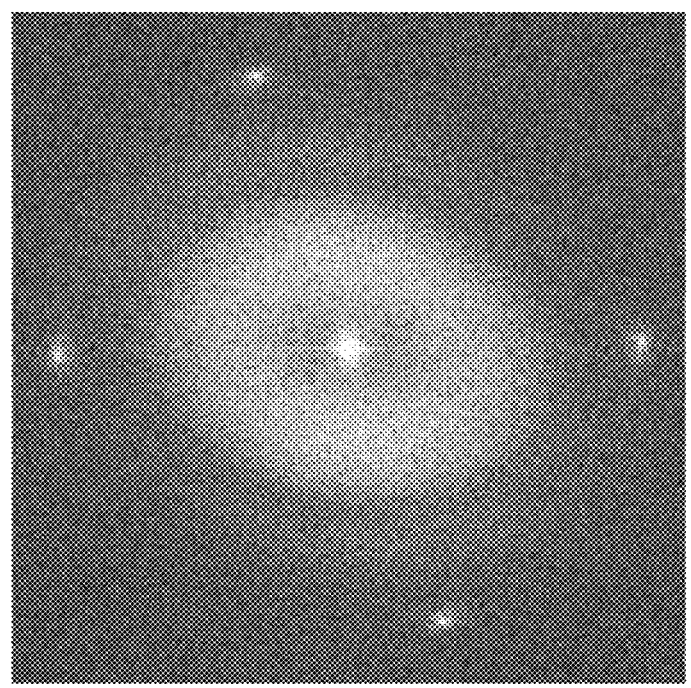
FIG. 11B is an X-ray diffraction image of a silicon bulk thermoelectric conversion material according to an example of the present invention.

First, the electron microscopy (SEM) observation images of the silicon bulk thermoelectric conversion material prepared by the present experiment are shown in FIG. 10. Further, FIG. 8, FIG. 9, FIG. 11A are TEM images of the nano-wire array structure obtained by metal assisted etching. Further, FIG. 11B is an X-ray diffraction image of the nano-wire array structure.

According to the electron microscopy (SEM) observation images of the silicon bulk thermoelectric conversion material prepared by the present experiment shown in FIG. 10, although a portion of the nanowire structure remains after pressure sintering, it can be seen that most of the nanowire structures are crushed to form a nano-porous structure. From these results, it was clarified that the silicon bulk thermoelectric conversion material exceeding ZT=0.2 at room temperature can be manufactured by the combined technique of metal assisted etching, refinement using the holes 27 by pressurization, and spark-plasma sintering.

Furthermore, TEM observations were carried out to examine the nano-wire array structure in detail, as the nano-wire array structure, the nano-wire array structure was obtained with a very high aspect ratio of a diameter of about 100 nm and a length of about 50 μm, inside of which, as shown in FIG. 11A, the formation of the holes 27 of about tens nm (nano grain boundaries and nano pores) were confirmed (in FIG. 11A, the holes 27 are a black portion, the size of which is about several nm to several tens nm). These are dominantly smaller than the diameter of the nanowire (about 100 nm) and formed of the secondary pores by etching. Incidentally, from the X-ray diffraction image shown in FIG. 11B, the nano-wire array structure was revealed to maintain the crystalline nature although the secondary pores are formed by etching.

Figure 12A:
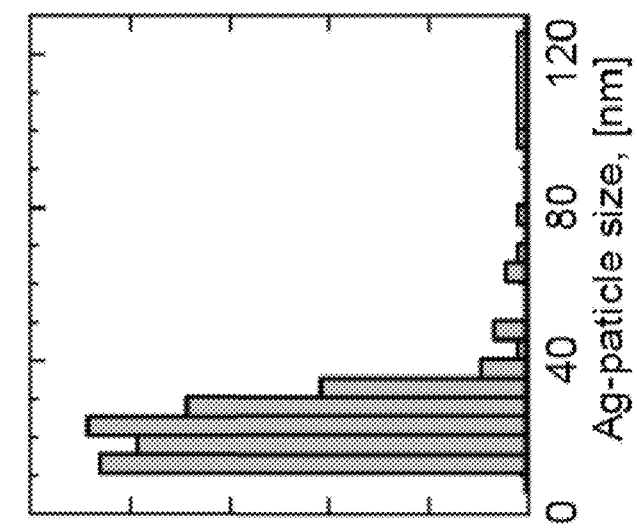
FIG. 12A is a diagram showing a distribution of grain diameters of silicon grains 100 according to an embodiment of the present invention.
Figure 12B:
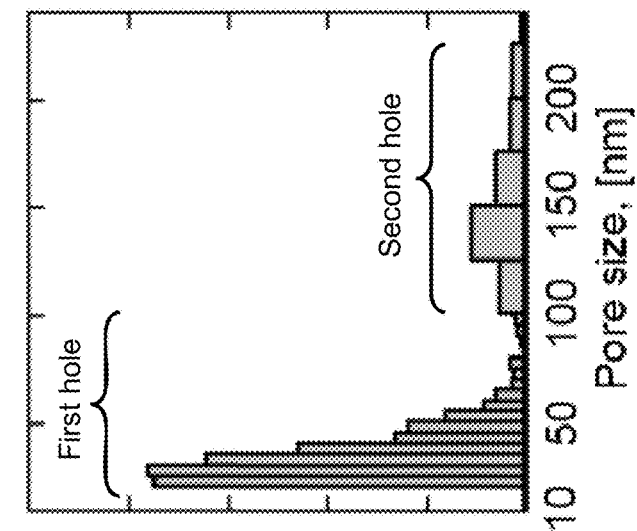
FIG. 12B is a diagram showing a distribution of sizes of first holes 200 and second holes 300 according to an embodiment of the present invention.
Figure 12C:
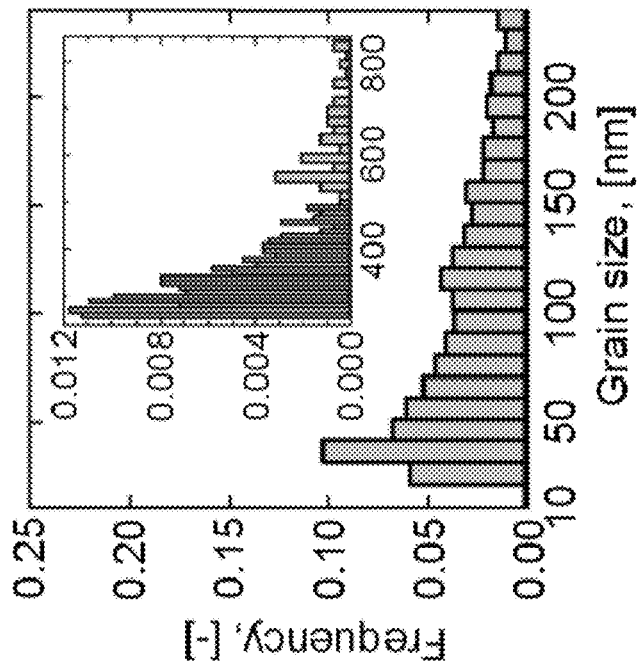
FIG. 12C is a diagram showing a distribution of sizes of a silver grain 23 according to an example of the present invention.

In addition, at HAADF-STEM (200000 magnification), an observation region with an area of 0.65 μm² was observed, a holes were detected using the image analysis software (Asahi Kasei Engineering Co., Ltd., A-zo Kun (registered trademark)), and the average size of the openings of the detected holes was calculated. FIGS. 12A to 12C are diagrams showing the evaluation results of the structure of the silicon bulk thermoelectric conversion material of Example 1. FIG. 12A shows the distribution of grain diameters of the silicon grains 100, FIG. 12B shows the distribution of the sizes of the first holes 200 and the second holes 300, and FIG. 12C shows the distribution of the sizes of the silver grains 23. From the results of FIG. 12A, it was apparent that the silicon grains 100 have an average value of a grain diameters in the range of 1 nm or more and 300 nm or less in the silicon bulk thermoelectric conversion material of Example 1. In addition, from the result of FIG. 12B, it was apparent that the first holes 200 have an average size in the range of 1 nm or more and 30 nm or less, and the second holes 300 have an average size in the range of 100 nm or more and 300 nm or less. Further, from the result of FIG. 12C, it was apparent that the silver grains 23 have an average size in the range of 1 nm or more and 30 nm or less.

[Measurement of Thermal Conductivity]

Figure 13:
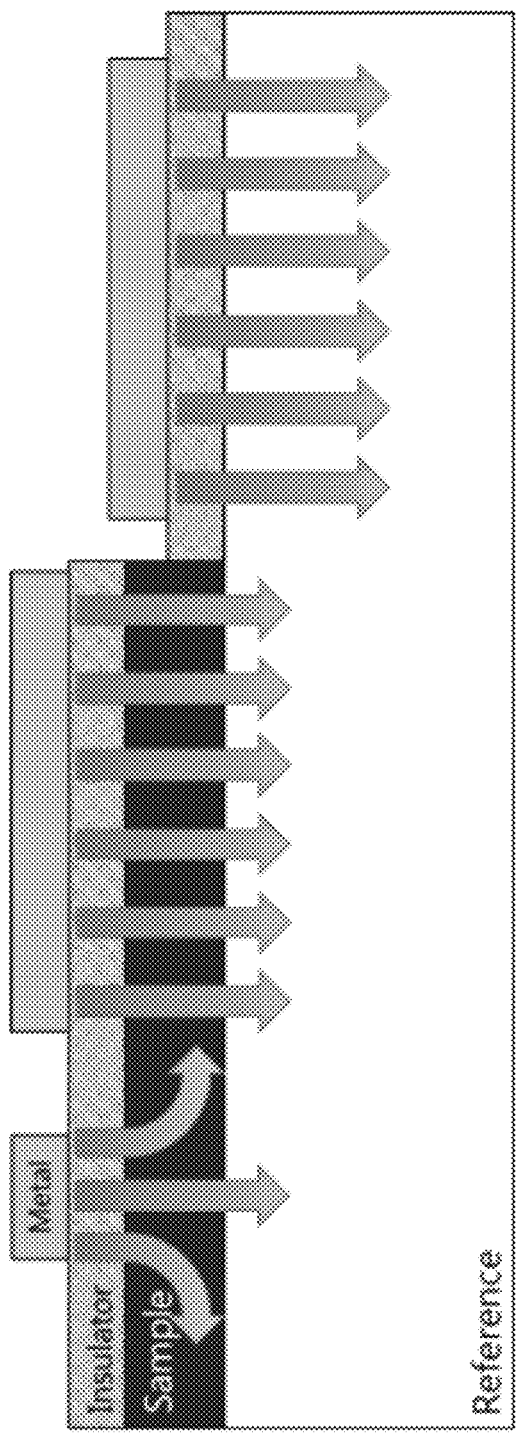
FIG. 13 is a diagram for illustration of the 3ω method of evaluating a silicon bulk thermoelectric conversion material according to an example of the present invention.

In one embodiment of the present invention, thermal conductivities in out-of-plane direction and in-plane direction of the silicon bulk thermoelectric conversion material are determined by the 3ω method (Jaeho Lee et al. April 2011 Thermal conductivity anisotropy and grain structure in Ge2Sb2Te5 films Journal of Applied Physics 109, 084902). The outline of the measurement will be described. FIG. 13 is a schematic view of measuring the thermal conductivity by the 3ω method. The 3ω method is a technique for obtaining a thermal conductivity from the temperature change by detecting the temperature change of the sample surface at the time of heating the sample surface by applying an AC current to the metal fine wire formed on the sample surface from the 3ω component in the AC voltage applied to the metal fine wire. Here, the thermal conductivity in out-of-plane direction is obtained by measuring the temperature change between the measured sample and the reference sample respectively, and by substituting the respective values in the following equation.

[Expression 2]

$$\kappa_{sample} = \frac{Pd_{sample}}{2b[\Delta T_{sample}(\omega) - \Delta T_{reference}(\omega)]} \quad (2)$$

Here, the $K_{sample}$ indicates the thermal conductivity of the measured sample, P indicates power per unit length that flows through the metal fine wire, $d_{sample}$ indicates the thickness of the measured sample, 2b indicates the width of the metal fine wire, and the $\Delta T_{sample}$ and $\Delta T_{reference}$ indicates the temperature change of the metal fine wire of the measured sample and the reference sample, respectively. The thermal conductivity of In-plane direction can be obtained by measuring the 3ω components for metal fine wires of different linewidths. When a metal fine wire with a wide line width is used, as shown in FIG. 13, most of the heat flow generated from the metal fine wire flows in out-of-plane direction of the measured sample. On the other hand, when a metal fine wire with a narrow line width is used, a part of the heat flow generated from the metal fine wire flows in out-of-plane direction, and a part of the heat flow flows in in-plane direction. Therefore, by measuring the 3ω components of the metal fine wires having different linewidths and fitting the results by the following equation, it is possible to obtain the anisotropy ratio of the thermal conductivity in out-of-plane direction and in-plane direction.

[Expression 3]

$$\Delta T = \frac{P}{2\pi L}\int_0^\infty \frac{B^+(\lambda) + B^-(\lambda)}{B^-(\lambda)A^+(\lambda) - B^+(\lambda)A^-(\lambda)} \frac{\sin^2(b\lambda)}{b^2\lambda^2} \frac{1}{\kappa_{n,out}\gamma_n} d\lambda$$

$$\gamma_n = \sqrt{\eta_n\lambda^2 + \frac{i\omega}{D_n}} \quad (3)$$

Here, ΔT is the temperature change, D is the thermal diffusivity, η is the anisotropy ratio of the thermal conductivity in out-of-pane and in-plane directions, $B^+(\lambda)$, $B^-(\lambda)$, $A^+(\lambda)$, and $A^-(\lambda)$ are the dimensionless parameters calculated recursively based on the number of layers of the samples, respectively. The anisotropy ratio of the thermal conductivity was obtained by fitting η as a fitting parameter to the frequency dependence of the temperature change obtained as the experimental result, and the thermal conductivity in in-plane direction was obtained from the value.

[Results of Thermal Conductivity Measurement]

As a result of measuring the thermal conductivity of the manufactured silicon bulk thermoelectric conversion material by 3ω method, the thermal conductivity in out-of-plane direction 1.86 [W/(m·K)], the thermal conductivity in in-plane direction 1.48 [W/(m·K)] was obtained. This thermal conductivity is a very low value of about 1% when compared to the value of a general silicon. Further, the thermal conductivity of the amorphous silicon is a value of about 2 [W/(m·K)], it is possible to realize a low thermal conductivity comparable to this. Further, as is clear from the results of out-of-plane direction and in-plane direction each of the thermal conductivity, the anisotropy ratio of the thermal conductivity is very low. This result indicates that the thermal conductivity of the nanowire structure remaining in a part does not significantly affect the thermal conductivity, and that the thermal conductivity can be greatly reduced by the nano-porous structure portion. On the other hand, as is evident from the TEM image (FIG. 11A), the porosity of the porous structure portion is not so high. Therefore, it is expected that a significant reduction in electrical conductivity can be suppressed in the present structure. It is considered that the above result shows the possibility of drastic improvement of the thermoelectric conversion performance by this technique.

As a result of measuring the thermoelectric performance of the silicon bulk thermoelectric conversion material according to the present example, significant improvement in which ZT at room temperature is 0.3 or more at the highest or 0.17 even on the average of a large number of samples is obtained, this is more than 100 times the value of the conventional bulk silicon. With moderate control of the nanostructure manufacturing condition, materials with small ratio of larger value of ZTs to smaller value of ZTs among ZTs in out-of-plane and in-plane directions, e.g., 0.240 and 0.303, or 0.180 and 0.202, can be manufactured. On the other hand, when the margin of the manufacturing condition is expanded, a material having a property difference of about twice the ratio of the ZT of one of the two is 0.2 or more and the ZT of the other is 0.1 to 0.2. Nevertheless, as long as the ratio is up to this degree, even if the installation angle of the material somewhat deviates from the design at the time of manufacturing the thermoelectric conversion device, since the change in the characteristics can be kept small, it is sufficiently available as a bulk material.

[Electrical Property]

Figure 14:
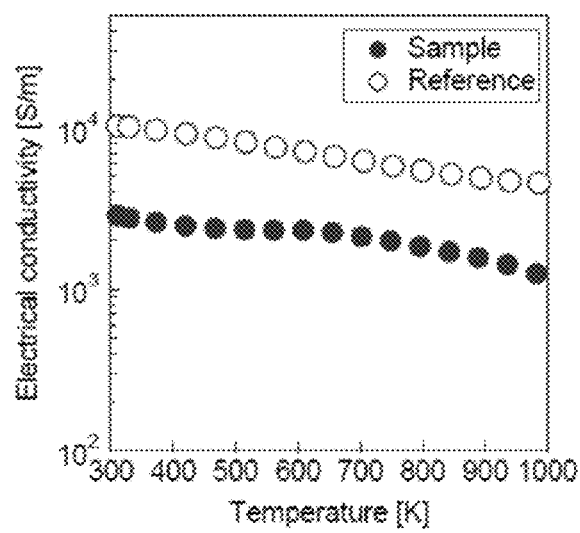
FIG. 14 is a graph showing the electrical properties of a silicon bulk thermoelectric conversion material according to an example of the present invention.
Figure 14:
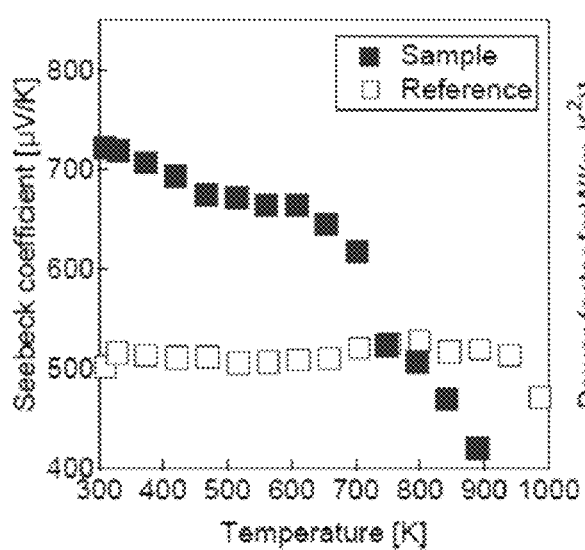
Figure 14:
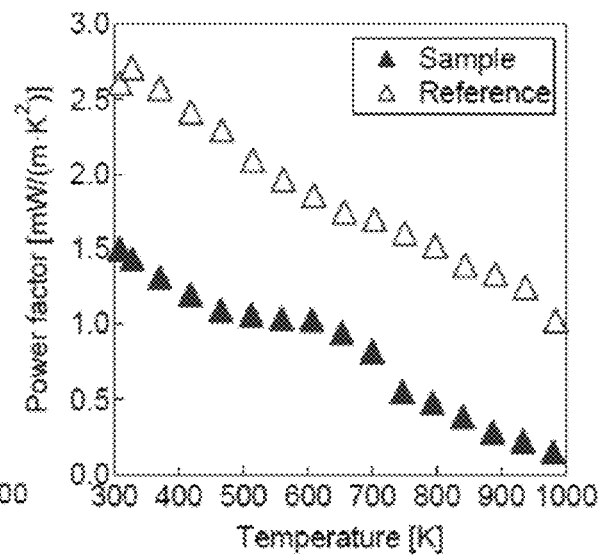

After connecting four terminals to the silicon bulk thermoelectric conversion material according to the present example, the electrical property was measured by performing Hall-effect measurement. Specifically, the field-effect mobility was measured at room temperature, and the electronic carrier concentration and the conductivity were calculated. Field-effect mobility of the above silicon bulk thermoelectric conversion material was measured by Hall-effect measurement, the results shown in FIG. 14 are obtained. Specifically, compared with the silicon substrate indicated as reference, the field-effect mobility of less than half of it, and more specifically, ZT=0.2 or more in the field-effect mobility 33 or less was achieved. That is, since the Seebeck coefficient S was 720.9 µV/K, the electrical conductivity was 2876 S/m and the thermal conductivity was 1.48 W/m/K from the graph of FIG. 14, ZT was calculated as 0.2 at room temperature (300K). As shown in FIG. 14, the silicon bulk thermoelectric conversion material having the above configuration had less than or equal to $6 \times 10^{18}$ cm$^{-3}$ of the electronic carrier concentration and less than or equal to 2880 S/m of electrical conductivity.

TABLE 1

| | Carrier concentration cm$^{-3}$ | Mobility cm$^2$/V · s | Electric conductivity S/m |
|---|---|---|---|
| Silicon substrate Measured value | $9.33 \times 10^{18}$ | 68.93 | 10290 |
| EXAMPLE 1 | $5.48 \times 10^{18}$ | 32.79 | 2875 |

As described above, in the example, despite the elemental silicon, it succeeded in performance enhancement of the thermoelectric performance of the silicon bulk thermoelectric conversion material at around room temperature (ZT=0.2 or more) by adjusting its microstructure.

[Mechanical Property]

The mechanical property of the silicon bulk thermoelectric conversion material according to Example 1 was evaluated. As the mechanical property, the elastic modulus of the silicon bulk thermoelectric conversion material according to Example 1 was measured. The elastic modulus was measured using a nanoindenter (manufactured by Elionics Corporation, ENT-1100b). As Comparative Examples, the elastic modulus of a single crystal silicon substrate and the nano-polycrystalline body were measured. Prior to measuring the elastic modulus, the oxide layers formed on the surfaces of the silicon bulk thermoelectric conversion material of Example 1 and the single-crystal silicon substrate of Comparative Example were removed by hydrofluoric acid, and the elastic modulus was measured at room temperature.

Figure 15:
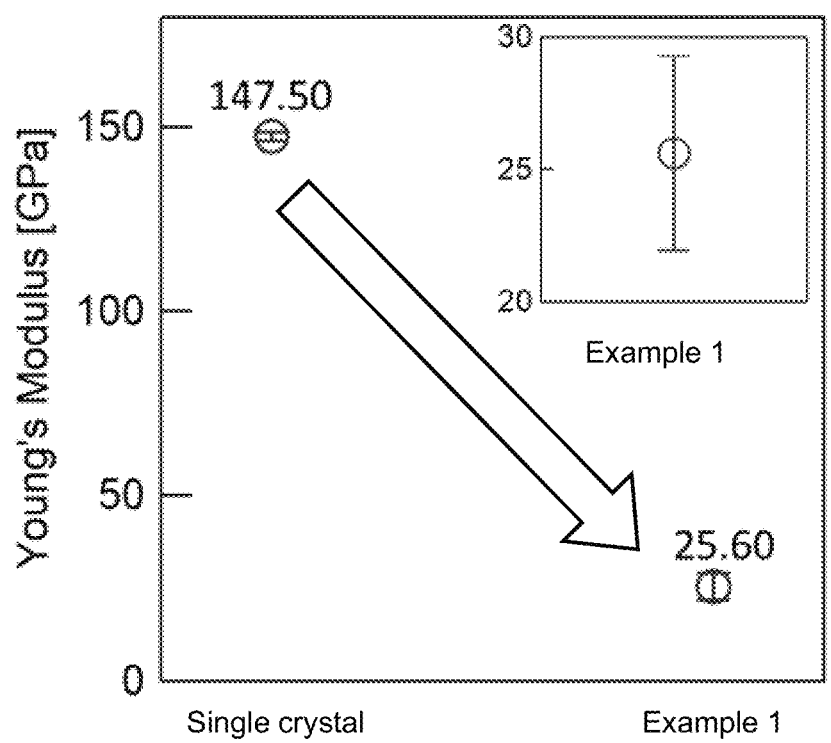
FIG. 15 is a diagram showing a measurement result of the elastic modulus according to an example of the present invention.

The measurement result of the elastic modulus is shown in FIG. 15. The average elastic modulus of the single-crystal silicon substrate was 147.5 GPa. On the other hand, the average elastic modulus of the silicon bulk thermoelectric conversion material according to the Example 1 was 25.60 GPa, and those of the measured samples were 30 GPa or less. Therefore, the grain interface of the silicon bulk thermoelectric conversion material according to Example 1 was shown to be softened significantly to that of the single-crystal silicon.

INDUSTRIAL APPLICABILITY

Especially, it is very useful in the industry that the nanostructure silicon with high thermoelectric performance was able to be produced in bulk scale. Silicon was expected to be a cost-effective thermoelectric material because of its abundance of reserves and the availability of conventional semiconductor processes. However, it has not been put into practical use because of its low thermoelectric performance. The present invention has succeeded in achieving high performance on a bulk scale and is an effective means of solving these problems. As a result, the spread of thermoelectric power generation as an IoT power source or the like can be expected to rapidly progress worldwide.

According to an embodiment of the present invention, a practical silicon bulk thermoelectric conversion material can be provided.

The invention claimed is:

1. A silicon bulk thermoelectric conversional material, comprising:
   a plurality of silicon grains with an average size of 1 nm or more and 300 nm or less;
   first holes existing in and on the surface of the plurality of silicon grains, the first holes having an average size of 1 nm or more and 30 nm or less; and
   second holes existing between the plurality of silicon grains, the second holes having an average size of 100 nm or more and 300 nm or less,
   wherein the aspect ratio of the silicon grain is less than 10.

2. The silicon bulk thermoelectric conversional material according to claim 1, comprising silver grains with an average size of 1 nm or more and 30 nm or less.

* * * * *